(12) United States Patent
Yanasak et al.

(10) Patent No.: US 7,994,784 B2
(45) Date of Patent: Aug. 9, 2011

(54) SYSTEMS AND METHODS FOR RESCALING IMAGE INTENSITIES WITH DIFFUSION MRI TO SYNTHESIZE COMPLEX DIFFUSIVE GEOMETRIES

(75) Inventors: Nathan E. Yanasak, Crawfordville, GA (US); Tom C. Hu, Evans, GA (US)

(73) Assignee: Medical College of Georgia Research Institute, Inc., Augusta, GA (US)

( * ) Notice: Subject to any disclaimer, the term of this patent is extended or adjusted under 35 U.S.C. 154(b) by 259 days.

(21) Appl. No.: 12/321,198

(22) Filed: Jan. 15, 2009

(65) Prior Publication Data

US 2009/0190816 A1 Jul. 30, 2009

Related U.S. Application Data

(63) Continuation-in-part of application No. 12/220,172, filed on Jul. 21, 2008.

(60) Provisional application No. 61/126,458, filed on May 5, 2008, provisional application No. 61/011,165, filed on Jan. 16, 2008, provisional application No. 61/011,166, filed on Jan. 16, 2008, provisional application No. 60/961,458, filed on Jul. 20, 2007.

(51) Int. Cl.
*G01V 3/00* (2006.01)

(52) U.S. Cl. ..................................... 324/307

(58) Field of Classification Search .......... 324/300–322; 600/410–435; 702/57–84, 85–126, 189–199
See application file for complete search history.

(56) References Cited

U.S. PATENT DOCUMENTS

| | | | |
|---|---|---|---|
| 5,969,524 A * | 10/1999 | Pierpaoli et al. | 324/307 |
| 6,288,540 B1 * | 9/2001 | Chen et al. | 324/300 |
| 6,549,803 B1 * | 4/2003 | Raghavan et al. | 600/431 |
| 6,591,004 B1 * | 7/2003 | VanEssen et al. | 382/154 |
| 6,686,736 B2 * | 2/2004 | Schoen et al. | 324/303 |
| 6,815,952 B1 * | 11/2004 | Rose et al. | 324/307 |
| 6,845,342 B1 | 1/2005 | Basser et al. | |
| 6,969,991 B2 | 11/2005 | Bammer et al. | |
| 6,972,565 B2 | 12/2005 | Yokoi et al. | |
| 6,992,484 B2 * | 1/2006 | Frank | 324/307 |
| 7,330,026 B2 | 2/2008 | Wang et al. | |
| 7,346,382 B2 * | 3/2008 | McIntyre et al. | 600/407 |
| 7,355,403 B2 | 4/2008 | Chakraborty | |
| 7,408,345 B2 * | 8/2008 | Bammer et al. | 324/307 |
| 7,409,035 B2 | 8/2008 | Kaufman et al. | |
| 7,411,393 B2 | 8/2008 | Zhang | |
| 7,529,422 B2 * | 5/2009 | Wang et al. | 382/254 |
| 7,570,049 B2 | 8/2009 | Lange | |
| 7,643,863 B2 * | 1/2010 | Basser et al. | 600/410 |

(Continued)

OTHER PUBLICATIONS

Alexander, Hasan, Lazar, Tsuruda, Parker, Analysis of Partial Volume Effects in Diffusion-Tensor MRI, Magnetic Resonance in Medicine, 2001, p. 770, vol. 45.

(Continued)

*Primary Examiner* — Dixomara Vargas
(74) *Attorney, Agent, or Firm* — Gardner Groff Greenwald & Villanueva, PC

(57) ABSTRACT

A method for scaling MR signal intensity after noise has been removed is disclosed. Because the signal in a DTI series varies with the apparent diffusivity in the direction of an applied gradient, one can multiply image data collected under actual clinical conditions with a spatially-dependent scaling function to synthesize different spatial diffusion distributions, after removal of noise. Recombination of the data with the removed noise preserves the bias in the system.

15 Claims, 8 Drawing Sheets

U.S. PATENT DOCUMENTS

| | | | |
|---|---|---|---|
| 7,660,481 B2* | 2/2010 | Schaap et al. | 382/266 |
| 7,775,980 B2* | 8/2010 | Sumi | 600/442 |
| 7,834,627 B2 | 11/2010 | Sakai et al. | |
| 2009/0058417 A1 | 3/2009 | Yanasak et al. | |
| 2009/0190817 A1 | 7/2009 | Yanasak et al. | |
| 2009/0267603 A1 | 10/2009 | Yanasak | |
| 2010/0004527 A1* | 1/2010 | Dale et al. | 600/410 |
| 2011/0074423 A1 | 3/2011 | Krzyzak | |

OTHER PUBLICATIONS

Anderson, Theoretical analysis of the effects of noise on diffusion tensor imaging, 2001, pp. 1174-1188, vol. 46, Magn Reson Med.

Ardekani, Selva, Sayer, Sinha, Quantitative Metrics for Evaluating Parallel Acquisition Techniques in Diffusion Tensor Imaging at 3 Tesla, Investigative Radiology, 2006, p. 806, vol. 41.

Assaf, Freidlin, Rohde, Basser, New Modeling and Experimental Framework to Characterize Hindered and Restricted Water Diffusion in Brain White Matter, Magnetic Resonance in Medicine, 2004, p. 965, vol. 52.

Bammer, Auer, Keeling, Augustin, Stables, Prokesch, et al., Diffusion tensor imaging using single-shot Sense-EPI, 2002, pp. 128-136, vol. 48, Magn Reson Med.

Basser, Mattiello, Le Bihan, MR diffusion tensor spectroscopy and imaging, 1994, pp. 259-267, vol. 68, Biophys J.

Basser, Pajevic, Statistical artifacts in diffusion tensor MRI (DT-MRI) caused by background noise, 2000, pp. 41-50, vol. 44, Magn Reson Med.

Basser, Pierpaoli, Microstructural and physiological features of tissues elecidated by quantitative-diffusion-MRI tenso, 1996, pp. 209-219, vol. B111.

Bastin, Armitage, Marshall, A theoretical study of the effect of experimental noise on the measurement of anisotropy in diffusion imaging, 1998, pp. 773-785, Magn Reson Imaging.

Beaulieu, The basis of anisotropic water diffusion in the nervous system—a technical review, 2002, pp. 435-455, vol. 15, NMR Biomed.

Caan, De Vries, Khedoe, Akkerman, Van Vliet, Grimberger, Vos, Generating fiber crossing phantoms out of experimental DWIs, in Proceedings of the 2007 Medical Image Computing and Computer-Assisted Intervention (MICCAI) Conference, 2007.

Chang, Koay, Pierpaoli, Basser, Variance of estimated DTI-derived parameters via first-order perturbation methods, 2007, pp. 141-149, vol. 57, Magn Reson Med.

Chen, Hsu, Noise removal in magnetic resonance diffusion tensor imaging, 2005, pp. 393-407, vol. 54, Magn Reson Med.

Chen. B et al, Correction for direction-dependent distortions in diffusion tensor imaging using matched magnetic field maps, NeuroImage, 2006, pp. 121-129, vol. 30.

Chung, Lu, Henry, Comparison of bootstrap approaches for estimation of uncertainties of DTI parameters, 2006, pp. 531-541, vol. 33, Neuroimage.

Cook, Bai, Hall, Nedjati-Gilani, Seunarine, Alexandcer, Camino: Diffusion MRI reconstruction and processing, Cetre for Medical Image Computing, Department of Computer Science, University College London, UK.

Cook, Bai, Nedjati-Bilani, Seunarine, Hall, Parker, Alexander, Camino: Open-Source Diffusion-MRI Reconstruction and Processing, in Proceedings of the 14th Scientific Meeting of the ISMRM (2006), p. 2759. abstract #.

Dice, Measure of the Amount of Ecologic Association Between Species, Ecology, 1945, p. 297, vol. 25.

Dietrich, Heiland, Sartor, Noise correction for the exact determination of apparent diffustion coefficient at low SNR, 20001, pp. 448-453, vol. 45, Magn Reson Med.

Ding, Gore, Anderson, Reduction of noise in diffusion tensor images using anisotropic smoothing, 2005, pp. 485-490, vol. 53, Magn Reson Med.

Facon, Ozanne, Fillard, Tournoux-Facon, MR Diffusion Tensor Imaging and Fiber Tracking in Spinal Cord Compression, American Journal of Neuroradiology, 2007, p. 411, vol. 28.

Fieremans, Deene, Delputte, Ozeemir, Achten, Lemanhieu, The design of anisotropic diffusion phantoms for the validation of diffusion weighted magnetic resonance imaging, 2008, vol. 53.

Griswold, Jakob, Heidemann, Nittka, Jellus, Wang, Kiefer, Hasse, Generalized Autocalibrating Partially Parallel Acquisitions (GRAPPA), Magnetic Resonance in Medicine, 2002, p. 1201, vol. 47.

Gudbjartsson, Patz, The Rician distribution of noisy MRI data, 1995, pp. 910-914, vol. 34, Magn Reson Med.

Hagemen et al., A Diffusion Tensor Imaging Tractography Algorithm Based on Navier-Stokes Fluid Mechanics, 3rd IEEE international symposium on biomedical imaging: macro to nano, 2006, pp. 798-801.

Hagmann, DTI mapping of human brain connectivity : statistical fire tracking and virtual dissection, 2003, pp. 545-554, vol. 19, Neuroimage.

Hasan, Parker, Alexander, Magnetic Resonance Water Self-Diffusion Tensor Encoding Optimization Methods for Full Brain Acquisition, Image Analysis and Stereology, 2002, p. 87, vol. 21.

Horsfield, Jones, Applications of diffusion-weighted and diffusion tensor MRI to white matter diseases: a review, 2002, p. 570-577, vol. 15, NMR Biomed.

Horsfield, Using diffusion-weighted MRI in multicenter clinical trials for multiple sclerosis, 2001, pp. S51-S54, vol. 186, J Neurol.

Jellison, Field, Medow, Lazar, Salamat, Alexander, Diffusion Tensor Imaging of Cerebral White Matter: A Pictorial Review of Physics, Fiber Tract Anatomy, and Tumor Imaging Patterns, American Journal of Neuroradiology, 2004, pp. 356, vol. 25.

Jenkinson, A fast, automated, n-dimensional phase unwrapping algorith, Magnetic Resonance in Medicine, 2003, pp. 193-197, vol. 49.

Jones, Basser, "Squashing peanuts and smashing pumpkins": how noise distorts diffusion-weighted MR data, 2004, pp. 979-993, vol. 52, Magn Reson Med.

Koay, Chang, Carew, Pierpaoli, Basser, A unifying theoretical and algorithmic framework for least squares methods of estimation in diffusion tensor imaging, Journal of Magnetic Resonance, 2006, p. 115, vol. 182.

Landman, Farrell, Jones, Smith, Prince, Mori, Effects of diffusion weighting schemes on the reporucibility of DTI-derived fractional anisotropy, mean diffusivity, and principal eigenvector measurements 1.5T, NeuroImage, 2007, p. 1123, vol. 36.

Le Bihan, Breton, Lallemand, Grenier, Cabanis, Laval-Jeanet, MR imaging of intravoxel incoherent motions: application to diffusion and perfusion in neurologic disorders. 1986, pp. 401-407, vol. 161, Radiology.

Le Bihan, Mangin, Poupon, Calrk, Pappata, Molkko, et al., Diffusion tensor imaging: concepts and applications, 2001, pp. 534-546, vol. 13, J Magn Reson Imaging.

Lin, Validation of Diffusion Tensor Magnetic Resonance Axonal Fiber Imaging with Registered Manganes-Enhanced Optic Tracts, NeuroImage, 2001, p. 1035, vol. 14.

Mori, Frederiksen, Van Zijl, Stieltjes, Kraut, Solaiyappan, et al., Brain white matter anatomy of tumor patients evaluated with diffusion tensor imaging, 2002, pp. 377-380, vol. 51, Ann Neurol.

Pagani, Bammer, Horsfiel, Rovaris, Gass, Ciccarelli, Filippi, Diffusion MR Imaging in Mulltiple Sclerosis: Technical Aspects and Challenges, American Journal of Neuroradiology, 2007, pp. 411, vol. 28.

Panin et al., Diffusion tensor MR imaging of principal directions: a tensor tomography approach, Phys Med Biol, 2002, pp. 2737-2757, vol. 47.

Parker, Schnabel, Symms, Wehring, Barker, Nonlinear smoothing for reduction of systematic and random errors in diffusion tensor imaging, 2000, pp. 702-710, vol. 11, J Magn Reson Imaging.

Peled et al., Geometrically constrained two-tensor model for crossing tracts in DWI, Mag Reson Imaging, 2004, pp. 1263-1270, vol. 24.

Pierpaoli, Basser, Toward a quantitative assessment of diffusion anisotropy, 1996, pp. 893-906, vol. 36, Magn Reson Med.

Poupon, Perrin, Rieul, Mangin, Bihan, Validation of Q-Ball imaging with a diffusion fiber crossing phantom on a clinical scanner, poster presentation at the ISMRM Workshop on Methods for Quantitative Diffusion MRI of Human Brain, 2005.

Poupon, Rieul, Kezele, Perrin, Poupon, Mangin, New diffusion phantoms dedicated to the study and validation of high-angular resolution diffusion imaging (hardi) models, 2005, Magnetic Resonance in Medicine, vol. 60.

Pruessmann, Weiger, Scheidegger, Boesing, Sense: sensitivy encoding for fast MRI, pp. 952-962, vol. 42, Magn Reson Med.

Schluter et al., White Matter Lesion Phantom for Diffusion Tensor Data and Its Application to the Assessment of Fiber Tracking, Proc SPIE—The Intl Soc for Optical Engg., 2005, pp. 835-844, vol. 5746.

Skare, Li, Nordell, Ingvar, Noise considerations in the determination of diffusion tensor anistropy, 2000, p. 659-669, vol. 18, Magn Reson Imaging.

Sullivan, Pfefferbaum, Diffusion tensor imaging in normal aging and neuropsychiatric disorder, 2003, p. 244-255, vol. 45, Eur J Radiol.

Sundgren, Dong, Gomez-Hassan, Mukherji, Maly, Welsh, Diffusion tensor imaging of the brain: review of clinical applications, 2004, pp. 339-350, vol. 46, Neuroradiology.

Taouli, Martin, Qayyum, Merrimand, Vigernon, Yeh, Coakley, Parallel Imaging and Diffusion Tensor Imaging for Diffusion-Weighted MRI of the Liver: Preliminary Experience in Healthy Volunteers, American Journal of Neuroradiology, 2004, p. 677, vol. 183.

Thoeny, Dekeyzer, Oyen, Peeters, Diffusion-weighted MR Imaging of Kidneys in Healthy Volunteers and Patients with Parenchymal Diseases: Initial Experience, Raidology, 2005, pp. 911, vol. 235.

Tuch et al., Diffusion MRI of Complex Neural Architecture, Neuron, 2003, pp. 885-895, vol. 40.

Tuch, Reese, Wiegell, Makris, Belliveau, Wedeen, High Angular Resolution Diffusion Imaging Reveals Intravoxel White Matter Fiber Heterogeneity, Magnetic Resonance in Medicine, 2022, p. 577, vol. 48.

Von Dem Hagen, Henkelman, Orientational Diffusion Reflects Fiber Structure Within a Voxel, Magn. Reson. Med., 2002, p. 454, vol. 48.

Yanasak, Allison, Use of capillaries in the construction of an MRI phantom for assessment of diffusion tensor imaging: demonstration of performance, 2006, pp. 1349-1361, vol. 24, Magn Reson Imaging.

Zhuang J. et al., Correction of Eddy-Current Distortions in Diffusion Tensor Images Using the Known Directions and Strengths of Diffusion Gradients, J Magn Reson Imag., 2004, pp. 1263-1270, vol. 24.

Zou, Warfield, Bharatha, Tempany, Kaus, Haker, Wells, Jelesz, Kikinis, Statistical Validation of Image Segmentation Quality Based on a Spatial Overlap Index; Academic Radiology, 2004, p. 178, vol. 11.

Schott North America, Inc.; Components Enabling Biotechnology Research; www.us.schott.com; 2 pages; printed Feb. 11, 2011.

* cited by examiner

SYSTEMS AND METHODS FOR RESCALING IMAGE INTENSITIES WITH DIFFUSION MRI TO SYNTHESIZE COMPLEX DIFFUSIVE GEOMETRIES

CROSS-REFERENCE TO RELATED APPLICATION

This application is a continuation-in-part of U.S. patent application Ser. No. 12/220,172 filed on Jul. 21, 2008, which claims the benefit of the filing date of U.S. Provisional Patent Application Ser. Nos. 60/961,458 filed on Jul. 20, 2007; 61/126,458 filed on May 5, 2008; 61/011,165 filed on Jan. 16, 2008; and 61/011,166 filed on Jan. 16, 2008. This application further claims the benefit of the filing date of U.S. Provisional Patent Application Ser. Nos. 61/126,458 filed on May 5, 2008; 61/011,165 filed on Jan. 16, 2008; and 61/011,166 filed on Jan. 16, 2008. The disclosures of all of these applications are incorporated by reference in their entireties for all purposes.

TECHNICAL FIELD

The present invention relates generally to the field of medical imaging, and particularly to systems and methods for rescaling image intensities with diffusion MRI to synthesize complex diffusive geometries.

BACKGROUND OF THE INVENTION

Diffusion tensor imaging (DTI) is an MRI-based technique with great potential to enhance clinical diagnosis of pathology in structured tissue. In particular, DTI has shown promise in the area of neurological disease, exhibiting some sensitivity to identifying white-matter tumor extent, sclerotic lesions, and compression trauma in spine. In clinical research, DTI has been used to map white matter fiber trajectories in the brain. Other pathology that may be favorably characterized with DTI includes liver and renal diseases.

Despite its utility, the routine diagnostic application of DTI remains in its infancy. Reasons for this include that, considering the large amount of information that DTI provides as compared to an ordinary MR sequence, the clinical adoption of standardized protocols is lagging. During a DTI sequence, a series of images are generated by applying gradient magnetic fields along particular directions, to measure the directional dependence of diffusion. DTI reduces this series of measurements to a tensor at every image location, with each eigenvalue and eigenvector representing the apparent diffusion coefficient (ADC) values along principle axes of an ellipsoid. Precision of the measurements depends on the number of directions sampled and the choice of particular direction schemes. Furthermore, DTI measurements characterize tissue properties indirectly, including cellular size, orientation, heterogeneity, and cell permeability. Uncertainty persists in the understanding of how DTI measures correlate with these tissue characteristics and how they change with disease.

Procedures for quality assurance (QA) and for estimation/measurement of systematic uncertainty have yet to be developed for DTI. In comparison with a single intensity value per voxel measured using a T1-weighted MR sequence, the end-product of a DTI series is six values to define a tensor within a given reference frame, where the frame is defined by three orthogonal vectors. As expected, the effect of noise on DTI data is more complicated than for routine clinical images, leading to a systematic bias that depends on SNR (signal to noise ratio). In an effort to eliminate image distortion inherent to the echo-planar imaging sequences predominantly used in the clinic and to migrate to higher-resolution imaging, parallel imaging has been incorporated with DTI. Unfortunately, while the array coils necessary for parallel MR scanning systems show improved SNR overall, their use changes the spatial properties of the noise distribution over the image. This effect of non-uniformity in the spatial sensitivity of surface coils is enhanced further using parallel imaging, leading to regions where noise may be higher or have variable spatial correlation, decreasing sensitivity within these regions.

One complication with DTI QA procedures is the lack of a suitable test object that is stable and has similar properties to human or animal tissue to evaluate and correct systematic bias. Diffusion depends on temperature, so thermal stability of such objects can also be important. Another complication with DTI QA procedures is the effect of systematic error or noise in the measurements.

SUMMARY OF THE INVENTION

In example embodiments, the present invention provides a method for scaling MR signal intensity after noise has been removed. Because the signal in a DTI series varies with the apparent diffusivity in the direction of an applied gradient, one can multiply image data collected under actual clinical conditions with a spatially-dependent scaling function to synthesize different spatial diffusion distributions, after removal of noise. Recombination of the data with the removed noise preserves the bias. The spatially-dependent scaling function can be determined by a method of the present invention that uses a test object or "phantom" of the present invention. The method can include steps of a) scanning each DTI direction of the phantom at least twice (producing a set of resultant images for each direction); b) determining substantial noise in each image, using either the positive or negative values resulting from the subtraction of images in a given DTI direction from each other (in the case of using only two resultant images) or subtraction of intensity values from the mean in a histogram, for each given pixel in images in a given DTI direction (in the case of more than two, resultant images); c) removing the substantial noise from the resultant images via subtraction, d) averaging the data over the region of interest ("ROI") to reduce residual noise, e) scaling the de-noised data, and f) adding the substantial noise back to the data to preserve substantial bias, using the noise data removed from any of the images for a given direction.

Thus, the magnitude and spatial characteristics of image noise originating from the use of a particular DTI sequence is preserved. Given that the de-noised signal intensities from an image describe how much diffusive motion a water molecule has experienced during scanning, these intensities directly characterize the geometry of the phantom structures. As an example, the intensities of diffusion-weighted images that contain capillary structures are brighter per equivalent volume of water if diffusion is measured across the short axis of the capillary than if it is measured along its length. The scaling of de-noised intensities from such an image will mimic the behavior of stretching, compressing, or splicing the capillary structures in particular directions. As the functional dependence of the intensity on structure dimension is known, proper scaling factors can be derived for a variety of end results.

This method of the present invention is different from simulating data that one might acquire with a DTI sequence. A "simulation" is not testing the actual system performance of the scanner. A method of the present invention, however, "bundles" the system performance (or problems in performance) into the data as per an ordinary scan. As long as the images of the phantom are acquired operationally in a manner similar to an actual DTI scan, performance characteristics such as the effect of noise on data would be substantially present in the data. Thus, the synthesis of complex data sets using this data rescaling scheme in conjunction with a test object can serve to benchmark the quality of any DTI sequence that may be used in a clinical setting. Benchmarking of DTI data provides a number of benefits, including 1) appropriate comparison of DTI data within multi-center trials; 2) appropriate ranges of uncertainty that could be presented with an examination, to improve the characterizing of tissue (e.g., tumor demarcation, white matter infiltration) for pre-surgical planning; 3) characterization of MR scanner performance over time at an institution, for maintenance decisions; 4) characterization of new protocols within the clinic, for robustness to noise; and 5) standardize current clinical MRI systems for multiple scanner providers. Extensions of this idea to objects other than phantoms of the present invention (e.g., human or animal tissue, clinical use) may include improved directional determination of white-matter fascicles, for pre-surgical planning.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

DETAILED DESCRIPTION OF EXAMPLE EMBODIMENTS

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

The present invention provides a system and method for providing quality assurance of ADC ("apparent diffusion coefficient") values obtained when scanning an object, such as tissue of a human or animal subject, with a DTI sequence of an MRI scanner. As a spatial distribution of ADC values are used to calculate other clinical metrics of DTI (e.g., fractional anisotropy), this invention also can provide quality assurance of DTI metrics in general. Additionally, the present invention also provides a phantom or test object that can be scanned by an MRI using a DTI (or other) sequence to provide a baseline reading for DTI analysis of tissue of a human or animal subject. Accordingly, once a baseline is obtained, a practitioner can employ one or more methods of the present invention to scan tissue of a human or animal subject to separate apparent anomalies in the tissue from systematic bias in DTI.

Phantom Examples

The present invention provides example phantoms or test objects that can be scanned to provide a baseline reading for DTI analysis of tissue of a human or animal subject. Other suitable phantoms, including those described in U.S. patent application Ser. No. 12/220,172 filed on Jul. 21, 2008 the contents of which are expressly incorporated herein by reference, can be used with the systems and methods of the present invention.

Figure 1:
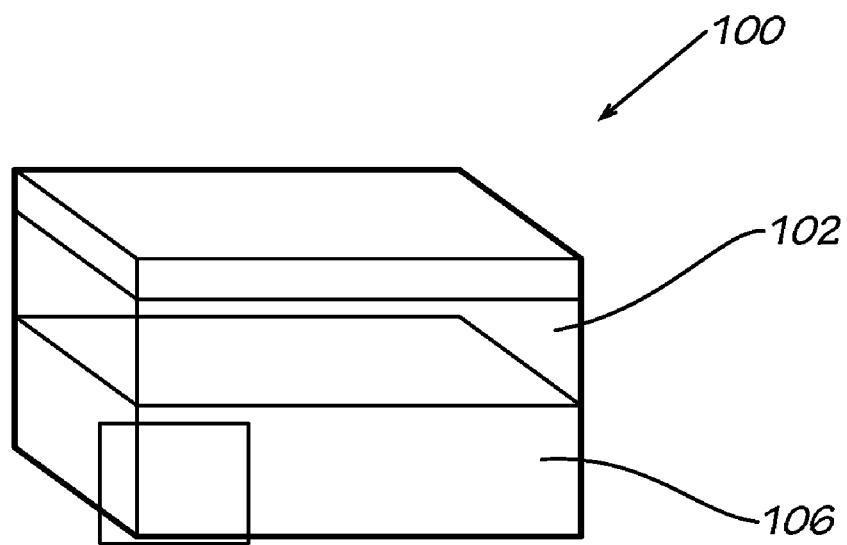
FIG. 1 depicts a perspective view of a phantom for use with DTI imaging according to a first example embodiment.
Figure 2:
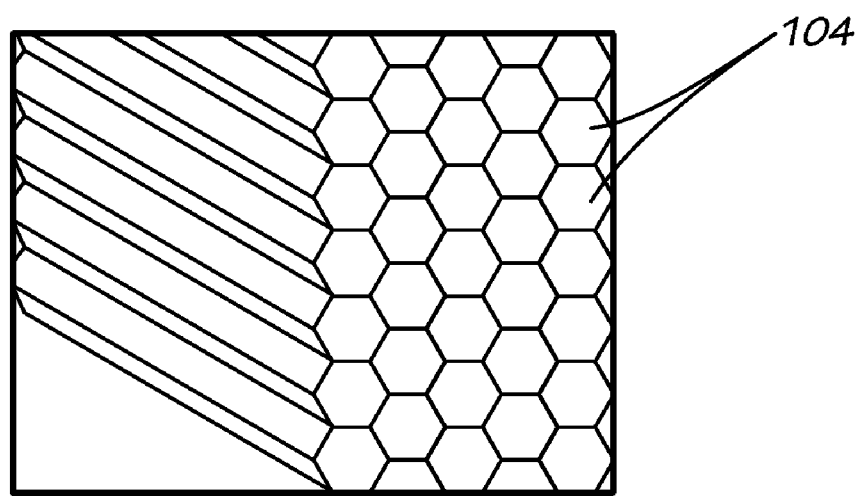
FIG. 2 depicts a detailed view of a portion of the phantom of FIG. 1.

As shown in FIGS. 1 and 2, in a first example embodiment, the phantom 100 includes a housing 102 that contains a one assembly of a plurality of capillary arrays 104 therein, with each capillary closely abutting adjacent capillary arrays. Together, the plurality of capillary arrays 104 forms a macro-array 106. Hereafter, any larger-scale assembly of capillary arrays shall be referred to as a "macro-array". As shown, each capillary array 104 is hexagonal in shape. The hexagonal shapes of the capillary arrays 104 within the housing 102 facilitate stacking of the capillary arrays into the macro-array, which as shown in FIG. 1 is generally rectangular in appearance and conforms to the shape of housing 102. Alternatively, the capillary arrays can be any suitable size or shape, such as trapezoidal, triangular, octagonal, rectangular, etc.

Figure 3:
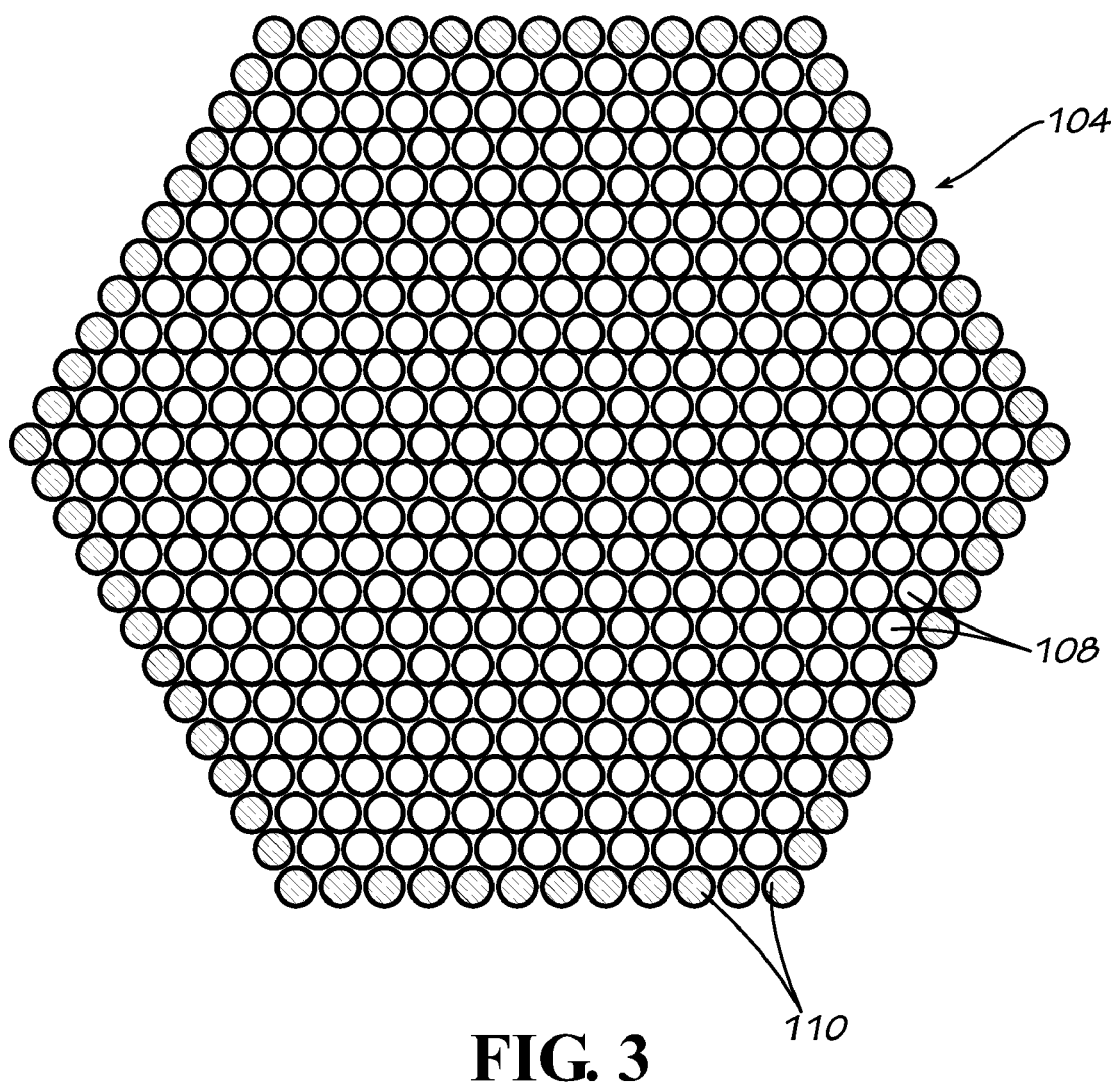
FIG. 3 depicts a sectional view of one capillary array in FIG. 2.

Preferably, each capillary array 104 includes a plurality of glass capillaries 108 therein, as shown in FIG. 3. In a typical example embodiment, glass capillaries 108 are used because they are generally easier to manufacture with high-precision diameters. Additionally, the formulation of glass can be such that its magnetic susceptibility can be closely matched to that of water. Other suitable materials, such as plastics, can be used for the capillaries 108. In a typical example embodiment, each capillary's internal diameter is between about 10 and 90 microns and more preferably between about 20 and 82 microns. Preferably, all of the capillaries 108 are completely filled with water, although in alternative embodiments, the capillaries can be substantially or partially filled with water. Optionally, each capillary can include an amount of a suitable contrast dopant. An exemplary capillary array 104 is a hexagonal capillary array having 397 capillaries 108 and 1470 interstitial pores of lesser volume with the whole array bounded by a layer of solid glass rods 110, as manufactured by Schott North America, Inc. (Southbridge, Mass.) and shown in FIG. 3. Preferably, the diameter of each glass rod 110 is equal to or substantially equal to the diameter of each capillary 108. Also preferably, the capillaries 108 and the glass rods 110 are in a close-packed hexagonal arrangement. Other suitable capillary arrays of other sizes and shapes can be employed as well.

Referring back to FIG. 1, the housing 102 can be constructed from any suitable material having a magnetic susceptibility that can be somewhat matched to that of water. Exemplary materials include polypropylene, polyethylene, glass, and PMMA, although those skilled in the art will understand that other suitable materials can be employed as well. In the depicted embodiment, the housing 102 has a substantially box-like shape measuring about one inch by about one inch by about one inch, although such dimensions are exemplary and can vary, and any suitable size and shape of housing can be used. For example in an alternative embodiment, a cylindrical housing with a screwtop lid can be employed.

The plurality of capillary arrays 104 can be bound together into the macro-array 106 with a water absorbent material, such as cotton string (not shown for purposes of clarity). In alternative embodiments, the capillary arrays 104 can be held together with a somewhat of an interference fit (such as a mechanical or pressure fit) if the housing is only slightly larger than the macro-array, thereby providing a mechanical force against the macro-array. Other suitable devices and techniques can be used to secure the capillary arrays 104 together and/or secure the macro-array within the housing so as to prevent the macro-array from moving while the phantom 100 is scanned.

As shown in FIG. 1 in the first example embodiment, all of the hexagonal capillary arrays 104 are aligned in the same direction and stacked on top of each other in the housing 102. The bottom row of capillary arrays 104 (i.e., the row of capillary arrays at the base of the housing) includes a series of voids 112 (or channels) between adjacent arrays. Similarly (and though not shown in the drawings for purposes of clarity), the top row of arrays 104 (i.e., the row of capillary arrays near the top or lid of the housing) includes a similar series of voids (or channels) between adjacent arrays. Alternatively, the top and bottom rows of arrays can include alternating hexagonal arrays and trapezoidal (i.e., "half-hexagonal") arrays that abut each other so as to create a hexagonal pattern with minimal or no space between adjacent arrays or between the arrays and the base of the housing. In another alternative form, instead of hexagonal arrays, all of the arrays can be trapezoidal, thereby providing an arrangement without the voids of FIG. 1.

In a typical example embodiment, there are generally enough capillary arrays 104 to fill or substantially fill the housing 102. A sufficient amount of water (such as distilled water) is placed inside of the housing and hence fills any voids between the arrays and between the arrays and the housing. In alternative embodiments, the macroarray of capillary arrays 104 fill only a portion of the housing 102. In such an embodiment, it may be advantageous to place a weight, such as a water-saturated piece of material (such as cotton) or fabric, on the macro-array 106 so as to keep the capillary arrays 104 in a tightly stacked configuration. However, when hexagonal or trapezoidal capillary arrays 104 are used, there is a natural tendency for the macro-arrays to stack in a tight configuration in shape.

Figure 4:
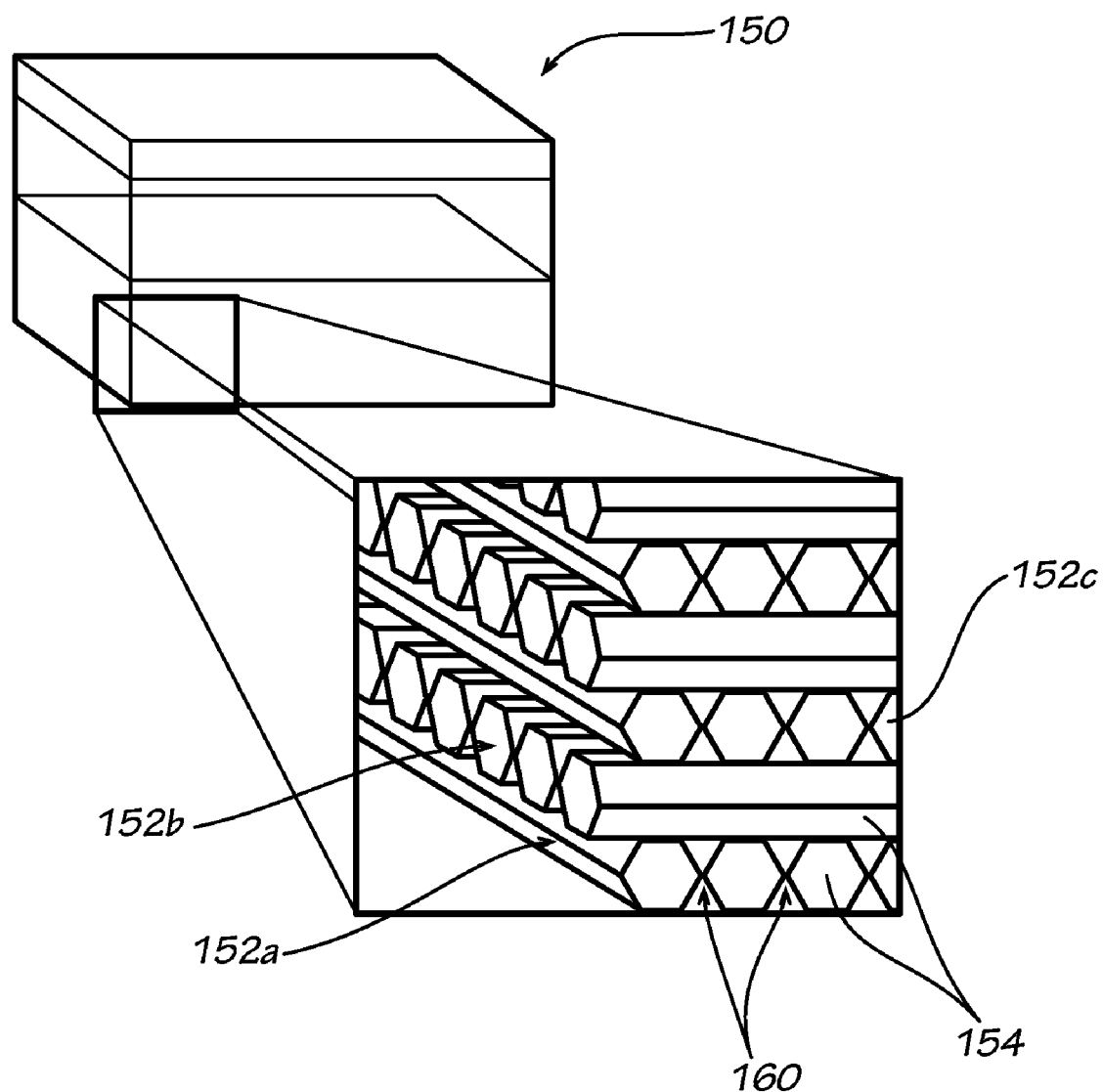
FIG. 4 depicts a perspective view of a phantom for use with DTI imaging according to a second example embodiment.

A second example embodiment of a phantom 150 is shown in FIG. 4. The phantom 150 is substantially similar to the phantom 100, but with the exceptions noted herein. Preferably, each row 152a-152n or layer of the capillary arrays 154 is rotated 90° relative to the previous layer, thereby creating alternating rows of arrays, as generally shown in FIG. 4. In other words, the capillary axes of each row are generally perpendicular to the two adjacent rows. As such, the phantom 150 generally behaves as a two-tensor diffusion distribution because of volume averaging of the crossing capillary layers. The data from the phantom 150 of this configuration can be used to confirm the general shape of a two-tensor diffusion distribution.

Notably, this stacking pattern of capillary arrays 154 in the phantom 150 allows more water to be located outside of the arrays, as shown by arrows 160. For example, the water 160 located outside of the arrays 154 can be approximately 40% by water volume. Because of the increase in water external to the arrays 154 (as compared to the phantom 100 of FIG. 1), higher ADC values in all directions and lower anisotropy can be expected.

In an alternative embodiment, the shapes of the arrays 154 can be trapezoidal. With such construction of rows rotated 90° relative to adjacent rows, flat layers of arrays can be built with alternating layers of capillaries (with fewer voids than that of FIG. 4), where the capillaries in each matrix (or row) can point to an arbitrary angle to other planes. Accordingly, the ADC values remain close to the same per plane of trapezoidal arrays.

Optionally, the water in the housings 102 can be lightly doped with a suitable contrast dopant, such as copper sulfate ($CuSO_4$), Gd-DPDT, or heavy water, to allow for shorter TR and/or TE, to alter the signal intensity, and to decrease sequence duration.

One or more of the phantoms 100, 150 of the present invention can be scanned with an MRI using a DTI sequence of the present invention to image the prolate ADC distributions in a region of interest ("ROI") containing the capillaries 108. Data from scans of the phantoms can then be used to synthesize other distributions.

Example Applications of the Invention

Prior to describing the system and method of the present invention, a review of how a DTI sequence measures diffusion is now discussed. Use of a Stejskal-Tanner sequence to measure water diffusion in tissue along a particular direction, $\hat{r}_i$, allows for the diffusion to be calculated in an image voxel according to this familiar equation:

$$S_i = S_o e^{-b_i d_i} \quad (1)$$

Here, $d_i$ is the apparent diffusion coefficient (ADC) measured along the direction $\hat{r}_i$. The measurement of ADC using a single diffusion-weighted (DW) image or a multi-direction DTI sequence requires the acquisition of an additional image with no diffusion weighting (a "b=0" image). In the above equation, $S_i$ is the DW-signal, and $S_o$ is the signal without any diffusion weighting. Both images share the same contrast weighting contribution from $T_2$ relaxation. The additional diffusion weighting for $S_i$ is controlled using magnetic gradients and is characterized by the parameter b, given by the following equation:

$$b_i = |g_i|^2 \gamma^2 \delta^2 \left(\Delta - \frac{\delta}{3}\right) \quad (2)$$

The strength, duration, and separation of the diffusion gradient pulses applied along $\hat{r}_i$ are given as $|g_i|$, $\Delta$ and $\delta$, respectively. $\gamma$ is the gyromagnetic ratio of the proton.

Assuming that 3D tissue diffusion can be represented using a diffusion tensor, D, the measured ADC value is the projection of the tensor along the gradient direction: $d_i = \hat{r}_i^T D \hat{r}_i$. One can apply a rotation, R, to the gradient coordinate system such that the eigenvectors of the tensor align with the coordinate axes:

$$d_i = \hat{r}_i^T D \hat{r}_i \quad (3)$$

$$= \hat{r}_i^T R^T D_\| R \hat{r}_i \quad (4)$$

$$= \hat{p}_i^T D_\| \hat{p}_i \quad (5)$$

In the coordinate system of the diagonalized tensor $D_\|$, the ADC value is sampled along some direction $\hat{p}_i = [\cos \theta_i; \cos \phi_i \sin \theta_i; \sin \phi_i \sin \theta_i]$, related to the gradient direction via the rotation R: $\hat{p}_i = R \hat{r}_i$.

$$d_i = \hat{p}_i^T D_\| \hat{p}_i \quad (6)$$

$$= \sum_{j=1}^{3} \lambda_j p_{ij}^2 \quad (7)$$

$$= \lambda_1 \cos^2 \theta_i + \lambda_2 \cos^2 \phi_i \sin^2 \theta_i + \lambda_3 \sin^2 \phi_i \sin^2 \theta_i \quad (8)$$

Figure 5:
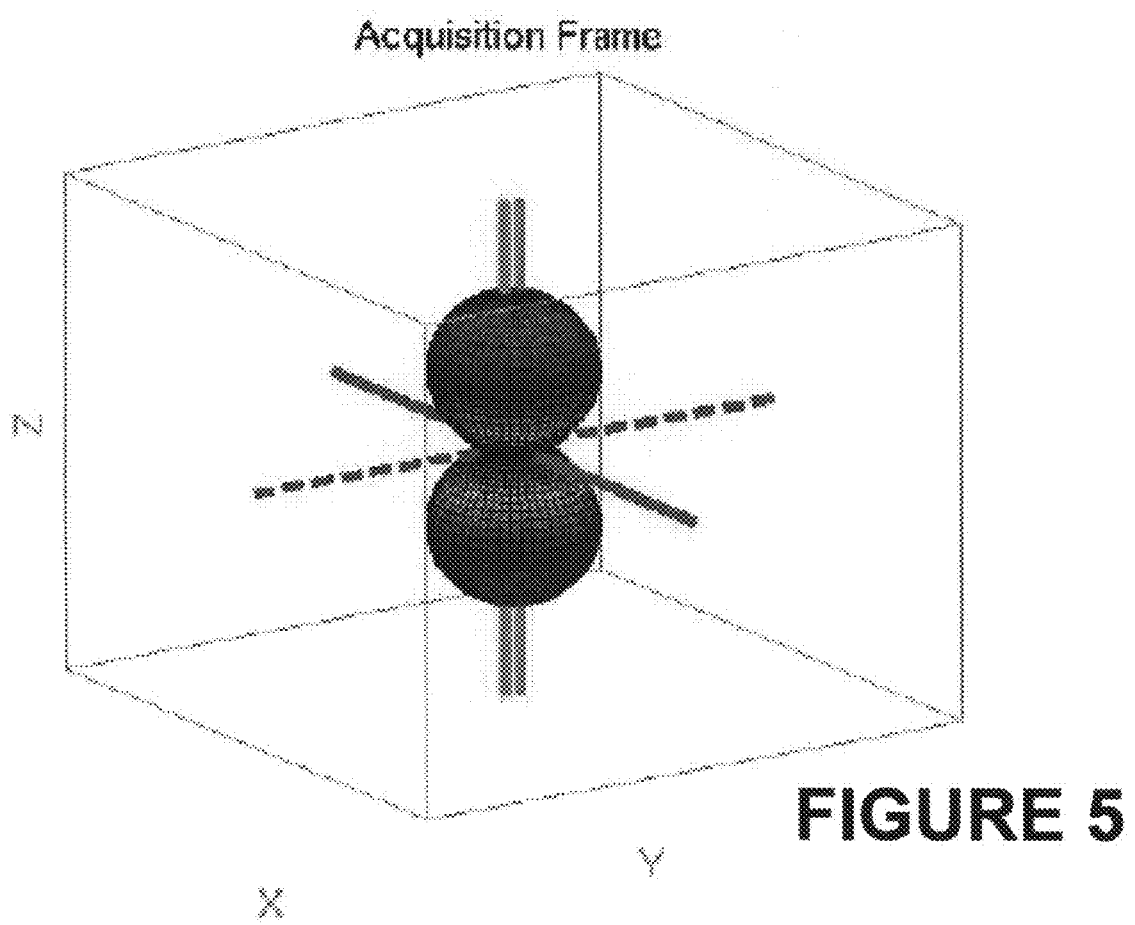
FIG. 5 depicts an acquisition frame from which a plurality of apparent diffusion coefficients ("ADCs") is acquired.

Here, $\lambda_i$ are the eigenvalues of the tensor, which lie along the x; y; z-axes in the frame of the diagonalized tensor. Because of the squared directional term in Equation 7, the sampled ADC distribution is proportional to the square of the angular distribution function describing actual diffusive behavior. For tensors with prolate symmetry (i.e., one large eigenvalue and two smaller, equal eigenvalues), associated with capillary structures, the distribution in Equation 5 forms the familiar "peanut" shape as depicted in FIG. 5 of the ADC distribution. Assuming cylindrical symmetry of the structure being imaged with the axis having the largest eigenvalue aligned along the z-axis, this distribution will specify an ADC value that can be measured by applying a gradient at the azimuthal and zenith angles ($\phi_i$; $\theta_i$) to the image plane.

The effect of systematic error or noise on the determination of $d_i$, leading to uncertainty or bias in eigenvalues, can be understood using Equations 1 and 2. Unstable or erroneous gradient performance can affect b, which can modulate $S_i$, $d_i$, and measurements of the tensor positively or negatively. On the other hand, noise in magnitude images follows a Rician distribution, adding a positive contribution to $S_i$ and to the non-DW b=0 signal ($S_o$) to a lesser extent. In general, this raises the value of $S_i$ when it becomes comparable to the mean value of noise, decreasing the measured value of $d_i$.

Method of DTI Signal Denoising, Scaling, and Renoising

Figure 8:
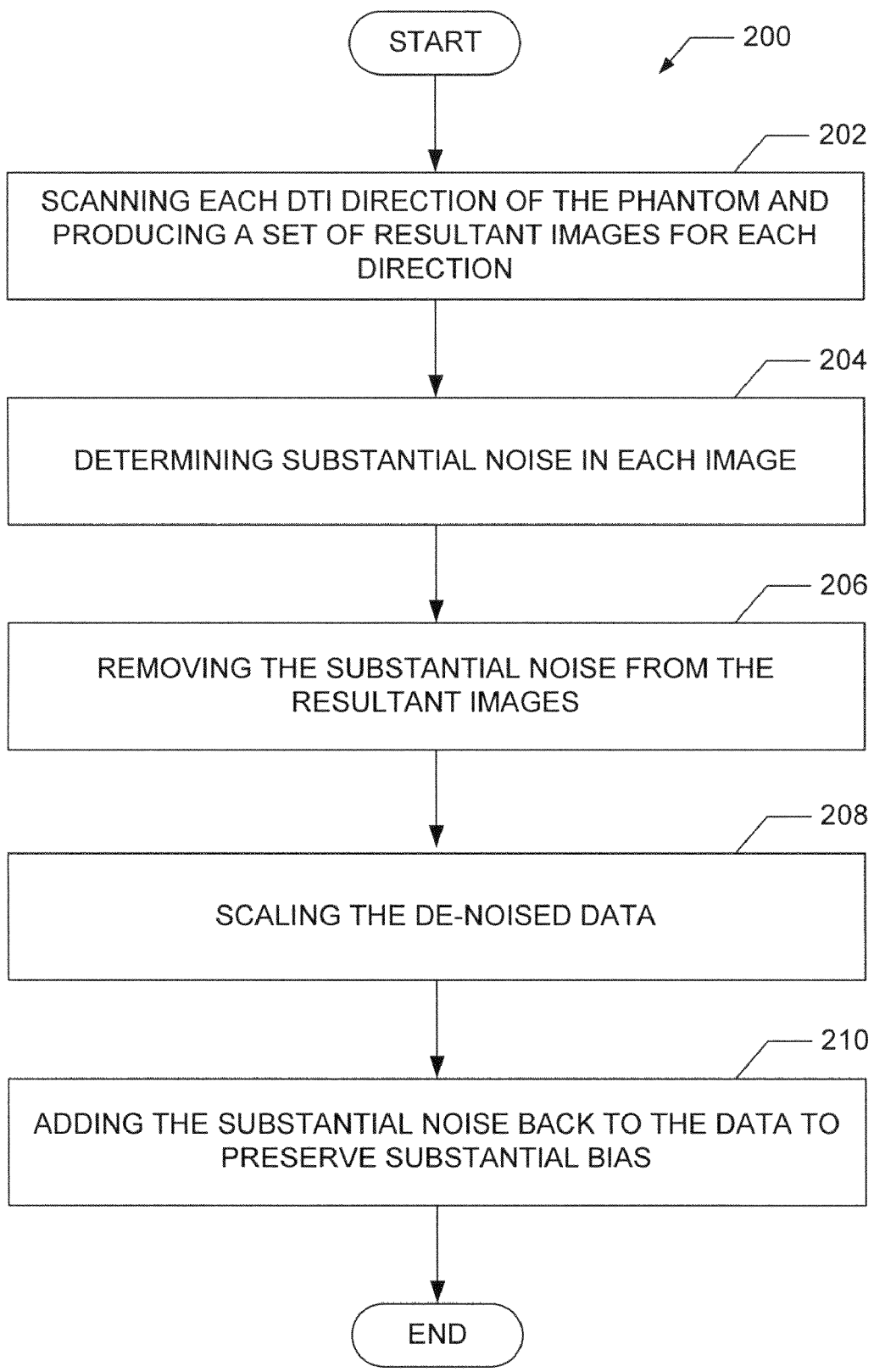
FIG. 8 depicts a flow diagram of a method of DTI signal denoising, scaling, and renoising according to an example embodiment of the present invention.

Referring now to FIG. 8, the present invention provides an example method 200 for synthesizing data with complicated diffusion characteristics from data exhibiting a prolate geometry by resealing of the observed signal intensities. Within a voxel in one image, one can separate signal and noise by acquiring a series of identical images. Thus, the method 200 begins at step 202 by scanning a plurality of DTI directions (and preferably scanning each DTI direction) of the phantom, such as phantom 100, and producing a set of resultant images for each scanned direction.

By acquiring duplicate copies of diffusion-weighted images for a set of applied diffusion gradients, noise can be substantially identified at step 204 and removed from an image at step 206, either via subtracting the copies and observing values that are greater than zero (using two duplicate images), or by computing a histogram of values in a pixel for all duplicates and determining the distribution of noise around the mean. After noise removal, the signal intensities in the "noiseless" image series, corresponding to differences in diffusion-weighted contrast, can be rescaled at step 208 before adding the noise again at step 210, allowing for the calculation of a different tensor. The noise characteristics of the synthesized data should be identical (or substantially similar) to real data under the same circumstances. Given the measured noise distribution, one can use this to determine how SNR affects the shape of any ADC spatial distribution.

The measurement of signal intensity, $S_i$, after applying a gradient along a particular direction, $\hat{r}_i$, results in a measurement of ADC, $d_i$:

$$d_i = \hat{r}_i^T D \hat{r}_i \quad (9)$$

$$= -\left|\frac{1}{b}\right| \ln\left(\frac{S_i}{S_o}\right)$$

Given any functional surface, f, to represent a sample of ADC values in particular directions, the resealing of image intensity from a measured value $S_i$ to the desired value $\tilde{S}_i$ on f would be given as follows:

$$\tilde{S}_i = S_o e^{-|b|f(\hat{r}_i)} \quad (10)$$

$$= S_o e^{-|b|d_i Y(\hat{r}_i)}$$

$$= k(\hat{r}_i) S_o e^{-|b|d} \quad (11)$$

where the image intensity scaling function, k, is specified in this manner:

$$k(\hat{r}_i) = e^{-|b|(f(\hat{r}_i) - d_i)} \quad (12)$$

Assuming that the scaled observations correspond to a different tensor, $\tilde{D}$, the newly scaled ADC $\tilde{d}_i$ would be given as follows:

$$\tilde{d}_i = Y(\hat{r}_i) d_i = r_i^T \tilde{D} \hat{r}_i \quad (13)$$

$Y(\hat{r}_i)$ is the scaling function for the measured ADC value. Increases or decreases in $d_i$ are specified as multiplicative. Taking the difference of Equations 9 and 13 and rearranging terms results in the final form of the tensor scaling function:

$$Y(\hat{r}_i) = \frac{\hat{r}_i^T \Delta D \hat{r}_i}{d_i} + 1 \quad (14)$$

The quantity ΔD is the change in the tensor from what was measured to the synthesized tensor: $\Delta D = \tilde{D} - D$. An equivalent form of Equation 12 containing ΔD for scaling the measured image intensities can be derived using Equation 14. Although the flexibility of this technique allows for the synthesis of essentially any distribution, one disadvantage relates to the Rician property of MRI noise. Related to the positive domain of signals in a magnitude image, image noise does not typically correspond to a Gaussian distribution with a mean of 0. As the MR signal becomes smaller, a Gaussian distribution may be a less accurate description of the data. As a consequence, the noise can possess a mean that is greater than zero and comparable to the signal. Thus, in such circumstance, subtraction of only two images to find noise may result in an underestimation of the noise. Scaling of "denoised" signals in this regime may also scale residual noise, amplifying its bias as a function of the scale factor and the amount of noise initially removed. Additionally, the present method assumes that noise is uniform across an ROI, which may not always be true.

EXAMPLE 1

Scanner behavior was simulated using MATLAB (Mathworks, Natwick, Mass.). The gradient directions chosen were distributed evenly over a sphere. The set of gradient directions were duplicated, and one set was rotated by 60° or 90° for acquisition. The principle axis of the measured prolate structure in the phantom 100 was assumed to point along the A-P axis in the scanner.

The phantoms 100 and 150 were scanned using a GE Excite HDx 3.0T MRI scanner (GE Medical Systems, Milwaukee, Wis.), using an eight-channel phased-array head coil. The phantoms 100 and 150 were configured using 20 μm i.d. capillaries bound into hexagonal arrays measuring approximately 0.5 mm in cross section. All arrays in the configuration of the phantom 100 were aligned in the same direction, to image the prolate ADC distributions in an ROI containing the capillaries. Data from scans of the phantom 100 were used to synthesize other distributions. For the phantom 150, each layer of the arrays was rotated 90° from the previous layer, behaving as a two-component diffusion distribution because of volume averaging of crossing capillary layers. The data from the phantom 150 was used to verify the general shape of the two-component distribution. While all water in designated ROIs for phantom 100 was contained within the arrays, the stacking pattern of phantom 150 led to a portion of water outside of the arrays shown by arrows 160 (which is approximately 40% by volume, considering a 50% water ratio inside of the arrays).

Figure 6:
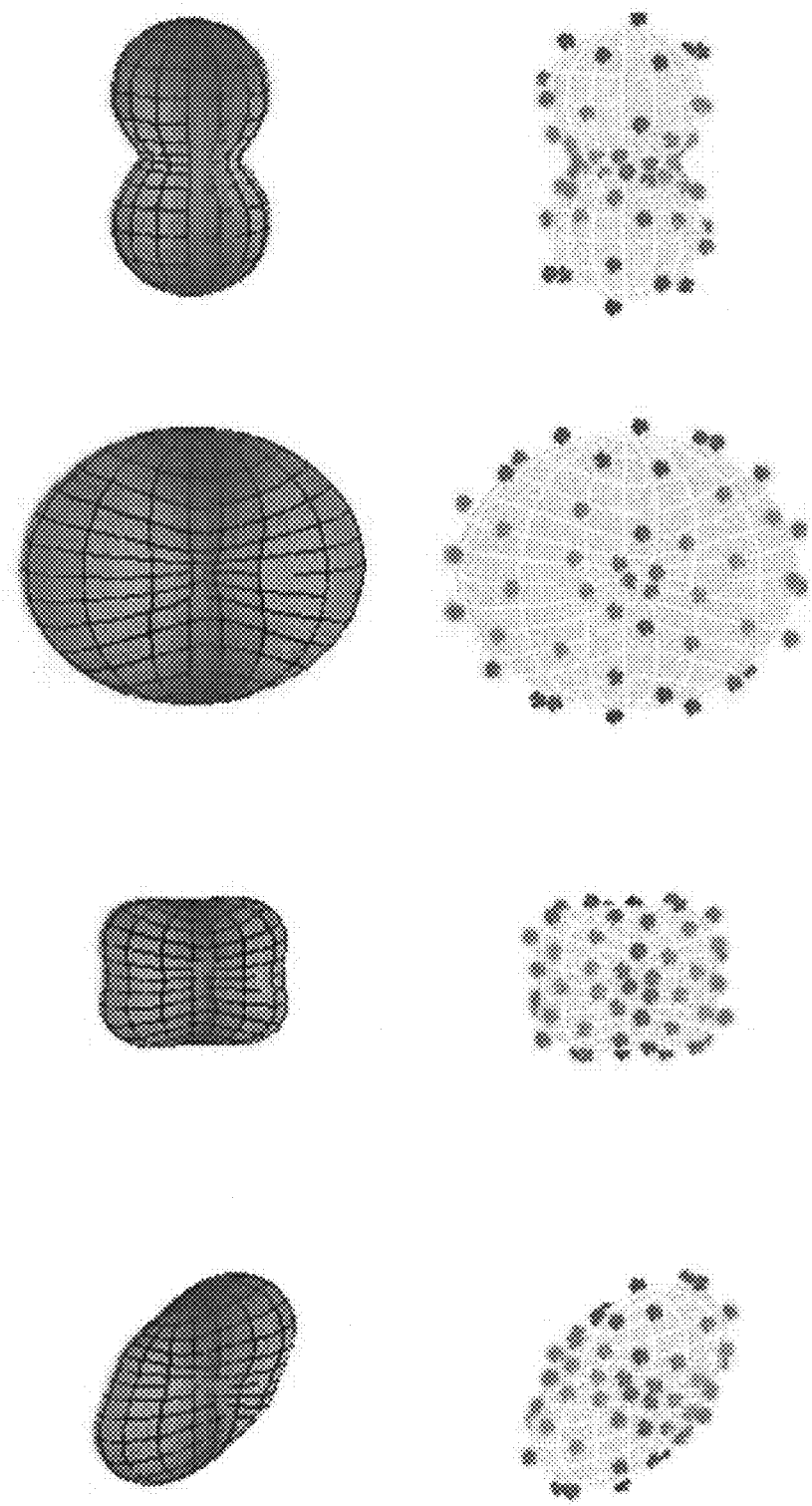
FIG. 6 depicts a comparison of the theoretical ADC distributions (in the first column) and measured/synthesized ADC values according to a method of the present invention (in the second column).

A series of data was acquired, using a 9-slice axially-oblique DTI sequence (5 b=0 images; b=1000 sec mm$^{-2}$; TR=4 sec; TE=78-81 msec; FOV=160 mm; slice thickness=4 mm; 1.5 mm gap; Acq. Matrix=128×128). The scan plane was chosen such that the arrays were coplanar and centered between slice boundaries of one image slice. Data were acquired with the phantom 100. The first series acquired two images per each of the 36 specified directions, to allow for noise to be subtracted and image intensities to be rescaled according to the method of the present invention. This series resulted in 36 different reconstructed directions. FIG. 6 depicts a comparison of the theoretical ADC distributions (in the first column) and measured/synthesized ADC values according to a method of the present invention (in the second column). The first row of images include the theoretical and the rescaled data when imaging the phantom 100. The remaining rows include the ADC distributions of oblate (second row), two prolates crossing at 90° (third row), and two prolates crossing at 600 (fourth row). ROIs were chosen that contains the array assembly only. ADC distributions measured within all voxels in the ROIs were averaged into one distribution. For prolate and oblate distributions, data within ROIs were fit to a global tensor. For the "intersecting prolates" data, ADC profiles were compared to a theoretical ADC distribution, based on the fit eigenvalues of the prolate tensor. RMS differences between the data and the distributions were calculated.

EXAMPLE 2

Figure 7:
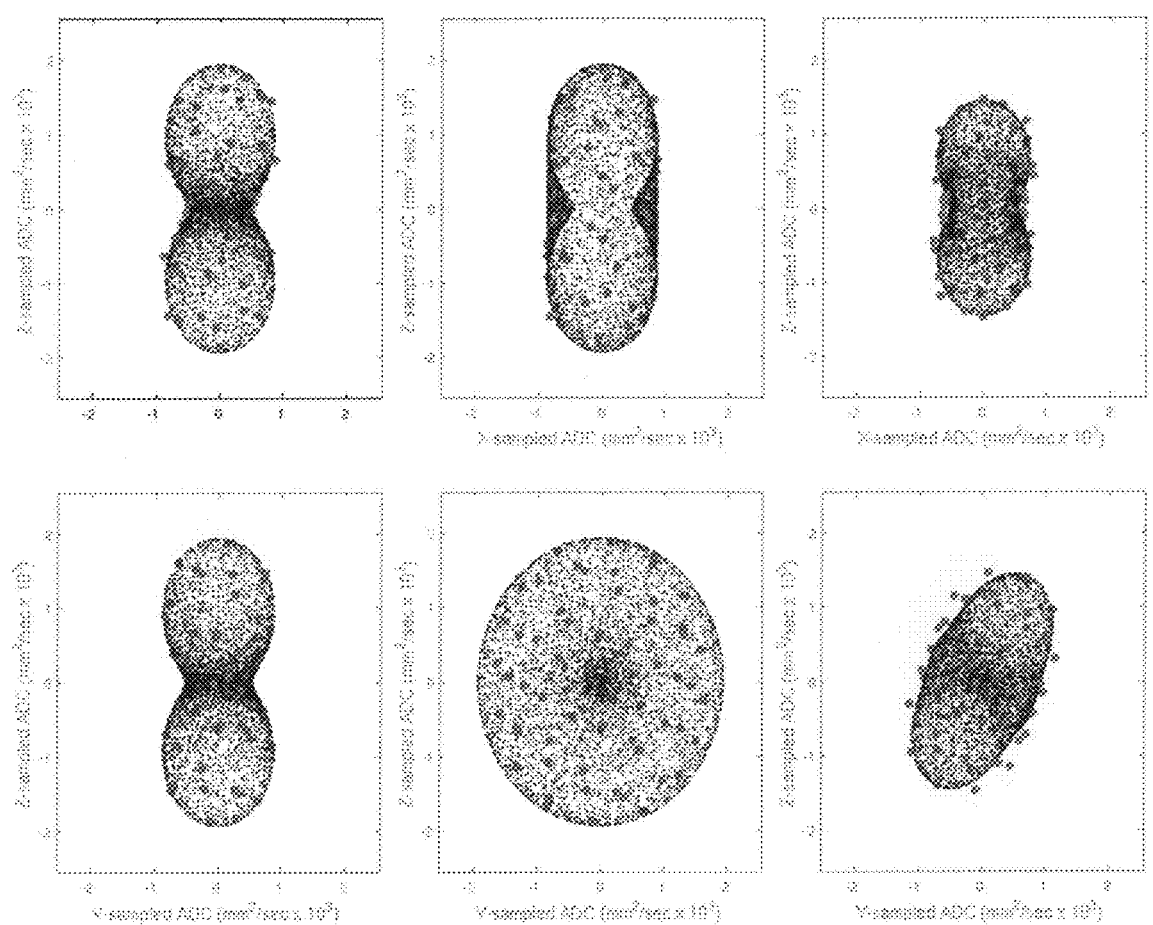
FIG. 7 demonstrates the scaling of a prolate diffusion tensor data (left column) measured using the phantom of FIG. 1 into an oblate tensor and into a distribution of two tensors crossing at 60°.

In a second example, FIG. 7 demonstrates the scaling of a prolate diffusion tensor data (left column) measured using the phantom 100 into an oblate tensor and into a distribution of two tensors crossing at 60°. Noise was removed and reintroduced using the method discussed herein above. As shown in FIG. 7, ROI-averaged distributions of 36 ADC values sampled over the unit sphere, for unscaled data for capillaries pointing along z-axis (column A), data scaled to oblate (column B), and data scaled to two tensors crossing at 60° (column C). The top row shows the distribution in the x-z plane, and the bottom row shows the distribution in y-z plane. Data in red measured using capillaries of the phantom 100 corresponded well will theoretical predictions (in black).

Figure 9:
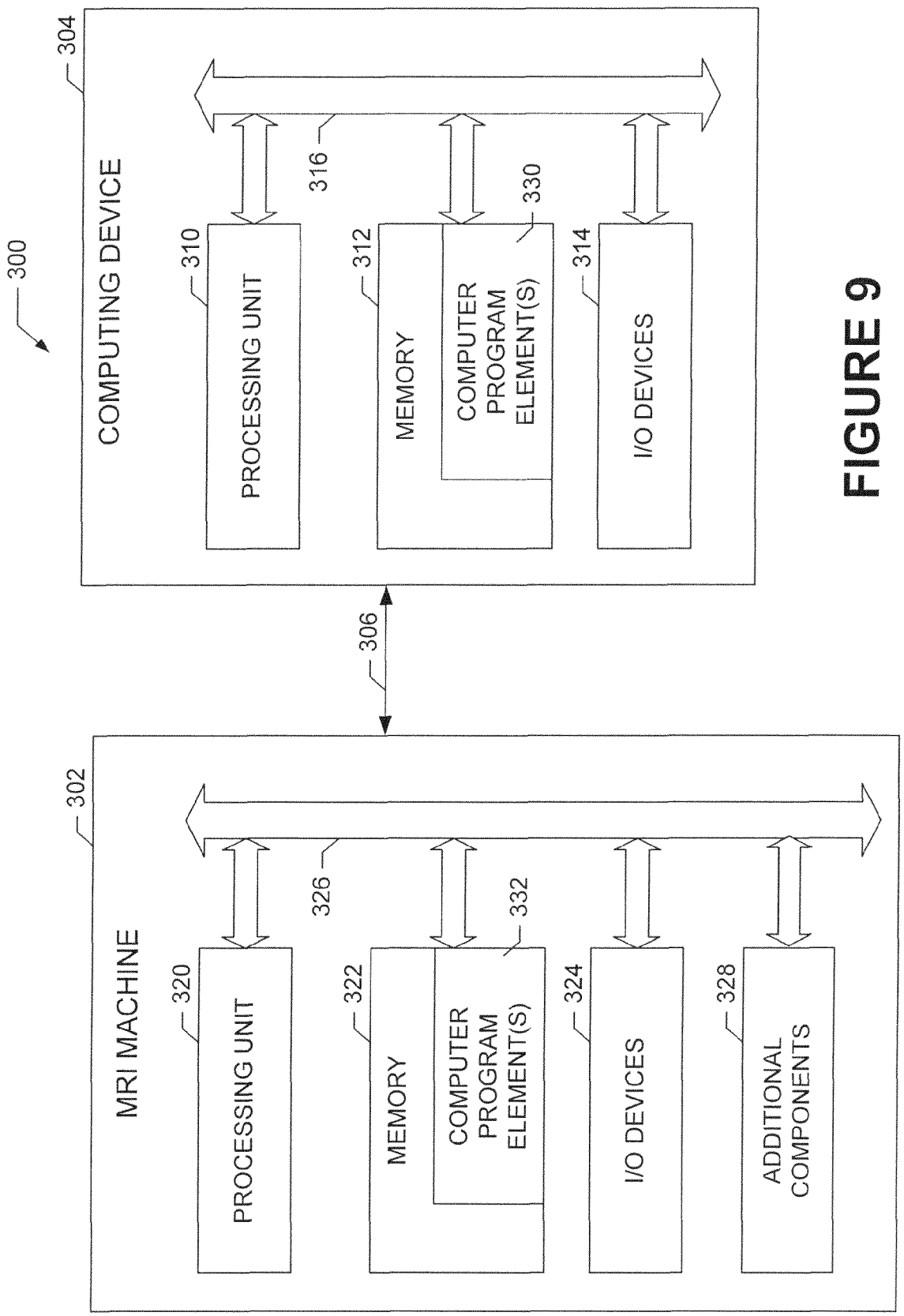
FIG. 9 depicts a block diagram of an example of a suitable computing system environment on which the invention may be implemented.

FIG. 9 depicts a block diagram of an example of a suitable computing system environment 300 on which the invention may be implemented. The computing system environment 300 is only one example of a suitable computing environment and is not intended to suggest any limitation as to the scope of use or functionality of the invention. Neither should the computing environment 300 be interpreted as having any dependency or requirement relating to any one or combination of components illustrated in the exemplary operating environment.

For example, the computing system environment 300 can be implemented on a conventional MRI machine and/or it can be implemented on other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, telephony systems, distributed computing environments that include any of the above systems or devices, and the like.

With reference to FIG. 9, an exemplary system 300 for implementing the invention includes a conventional MRI machine 302 configured for DTI imaging coupled to a general-purpose computing device in the form of a computer 304. The MRI machine 302 can be operatively coupled to the computer 304 via a suitable interface 306, such as a cable or via one or more networks, such as but not limited to: the Internet, a local area network (LAN), a wide area network (WAN), via a telephone line using a modem (POTS), Bluetooth, WiFi, cellular, optical, satellite, RF, Ethernet, magnetic induction, coax, RS-485, or other like networks. In such an embodiment, data obtained from scans by the MRI device 302 can be transmitted to the computer 304 for further manipulation.

Components of computer 304 may include, but are not limited to, a processing unit 310, a system memory 312, i/o devices 314, and a system bus 316 that couples various system components including the system memory to the processing unit. All of the components of the computer 304 are conventional and well known to those skilled in the art.

For example, the processing unit 310 is a hardware device for executing software that can be stored in memory 312. The processing unit 310 can be virtually any custom made or commercially available processor, a central processing unit (CPU), data signal processor (DSP) or an auxiliary processor among several processors associated with a server, and a semiconductor based microprocessor (in the form of a microchip) or a macroprocessor. Examples of suitable commercially available microprocessors are as follows: an 80×86 or Pentium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 312 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 312 may incorporate electronic, magnetic, optical, and/or other types of storage media. Note that the memory 312 can have a distributed architecture, where various components are situated remote from one another, but can be accessed by the processing unit 310.

Input/output devices 314 can include one or more of the following: a keyboard, a microphone, a pointing device, such as a mouse, trackball or touch pad, a joystick, game pad, satellite dish, scanner, monitor, display device, speaker, printer, or the like.

The system bus 316 can be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Additionally or alternatively, the methods of the present invention can be implemented in a conventional MRI machine having computing components similar to the computer 304, including a processing unit 320, a system memory 322, i/o devices 324, and a system bus 326 that couples various system components including the system memory to the processing unit 320, in addition to the conventional MRI components 328 (such as a coil, magnets, etc.). MRI machines are well known in the art, and thus, the internal components will not be discussed in detail.

The methods of the present invention can be embodied in computer program elements 330, 332. Computer program elements 330, 332 of the invention may be embodied in hardware (such as in the processing unit 320 or memory 322 of the MRI machine 302 or in the processing unit 310 or memory 312 of the computer 304 or computing device operatively connected to an MRI machine) and/or in software (including firmware, resident software, micro-code, etc.). If implemented in hardware, a system of the present invention be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. Computer readable media can be any available media that can be accessed by a computer or computing device and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

While the invention has been described with reference to preferred and example embodiments, it will be understood by those skilled in the art that a variety of modifications, additions and deletions are within the scope of the invention, as defined by the following claims.

What is claimed is:

1. A method for synthesizing data obtained from a DTI protocol in an MRI system, comprising:
   scanning with the MRI system a plurality of DTI directions of a test object having a plurality of anisotropic structures at least twice, wherein the test object comprises:
   a plurality of water-filled capillaries arranged into an array; and a housing, wherein the housing is substantially filled with a liquid, the array is housed within the housing, and the array has a generally polygonal-like shape and includes a plurality of arrays stacked in a plurality of rows in the housing and thereby forming a macro-array;

producing at least two sets of resultant images and associated data for each DTI direction;

determining an amount of noise in each of the resultant images;

removing the noise from the resultant images to yield a noiseless image;

scaling the data obtained from the scanning;

adding the removed noise to the data; and calculating a new tensor.

2. The method of claim 1, wherein the step of removing the noise further includes subtracting the two sets of images and observing values that are greater than zero.

3. The method of claim 1, wherein the step of removing noise from the images includes computing a histogram of values in a pixel for the duplicates copied and determining the distribution of noise around a mean.

4. The method claim 1, wherein the step of scanning a plurality of DTI directions includes scanning a first DTI direction of the test object, orienting a second DTI direction of the test object at 60 degrees from the first direction, and scanning the second DTI direction of the test object.

5. The method claim 1, wherein the step of scanning a plurality of DTI directions includes scanning a first DTI direction of the test object, orienting a second DTI direction of the test object at 90 degrees from the first direction, and scanning the second DTI direction of the test object.

6. A non-transitory computer-readable medium storing instructions that, when executed on a programmed processor, carry out a method for synthesizing data obtained from a DTI protocol in an MRI system, comprising:

instructions for scanning a plurality of DTI directions of a test object having a plurality of anisotropic structures at least twice, wherein the test object comprises:

a plurality of water-filled capillaries arranged into an array; and a housing, wherein the housing is substantially filled with a liquid, the array is housed within the housing, and the array has a generally polygonal-like shape and includes a plurality of arrays stacked in a plurality of rows in the housing and thereby forming a macro-array;

instructions for producing at least two sets of resultant images and associated data for each DTI direction;

instructions for determining an amount of noise in each of the resultant images;

instructions for removing the noise from the resultant images to yield a noiseless image;

instructions for scaling the data obtained from the scanning;

instructions for adding the removed noise to the data; and instructions for calculating a new tensor.

7. The computer-readable medium of claim 6, wherein the instructions for removing the noise include instructions for subtracting the two sets of images and observing values that are greater than zero.

8. The computer-readable medium of claim 6, wherein the instructions for removing the noise include instructions for computing a histogram of values in a pixel for the duplicates copied and determining the distribution of noise around a mean.

9. The computer-readable medium of claim 6, wherein the instructions for scanning a plurality of DTI directions include instructions for scanning a first DTI direction of the test object and scanning a second DTI direction of the test object, wherein the second direction is rotated by 60 degrees from the first direction.

10. The computer-readable medium of claim 6, wherein the instructions for scanning a plurality of DTI directions include instructions for scanning a first DTI direction of the test object and scanning a second DTI direction of the test object, wherein the second direction is rotated by 90 degrees from the first direction.

11. A system for synthesizing data obtained from a DTI protocol in an MRI system, comprising:

means for scanning a plurality of DTI directions of a test object having a plurality of anisotropic structures at least twice, wherein the test object comprises:

a plurality of water-filled capillaries arranged into an array; and a housing, wherein the housing is substantially filled with a liquid, the array is housed within the housing, and the array has a generally polygonal-like shape and includes a plurality of arrays stacked in a plurality of rows in the housing and thereby forming a macro-array;

means for producing at least two sets of resultant images and associated data for each DTI direction;

means for determining an amount of noise in each of the resultant images;

means for removing the noise from the resultant images to yield a noiseless image;

means for scaling the data obtained from the scanning;

means for adding the removed noise to the data; and means for calculating a new tensor.

12. The system of claim 11, wherein the means for removing the noise includes means for subtracting the two sets of images and observing values that are greater than zero.

13. The system of claim 11, wherein the means for removing the noise includes means for computing a histogram of values in a pixel for the duplicates copied and determining the distribution of noise around a mean.

14. The system of claim 11, wherein the means for scanning a plurality of DTI directions includes means for scanning a first DTI direction of the test object and a second DTI direction of the test object, wherein the second direction is rotated by 60 degrees from the first direction.

15. The system of claim 11, wherein the means for scanning a plurality of DTI directions includes means for scanning a first DTI direction of the test object and a second DTI direction of the test object, wherein the second direction is rotated by 90 degrees from the first direction.

* * * * *